United States Patent
Sdrulla et al.

(10) Patent No.: US 8,476,691 B1
(45) Date of Patent: Jul. 2, 2013

(54) HIGH RELIABILITY-HIGH VOLTAGE JUNCTION TERMINATION WITH CHARGE DISSIPATION LAYER

(75) Inventors: Dumitru Sdrulla, Bend, OR (US); Duane Edward Levine, Bend, OR (US); James M. Katana, Bend, OR (US); Martin David Birch, Louisville, CO (US)

(73) Assignee: Microsemi Corporation, Bend, OR (US)

( * ) Notice: Subject to any disclaimer, the term of this patent is extended or adjusted under 35 U.S.C. 154(b) by 199 days.

(21) Appl. No.: 13/030,907

(22) Filed: Feb. 18, 2011

Related U.S. Application Data

(60) Provisional application No. 61/305,601, filed on Feb. 18, 2010.

(51) Int. Cl.
*H01L 21/336* (2006.01)
*H01L 29/78* (2006.01)

(52) U.S. Cl.
USPC .... 257/315; 257/314; 257/324; 257/E27.103; 257/E29.302; 257/E21.682; 438/131; 438/257; 438/287

(58) Field of Classification Search
USPC .......... 257/315, 314, 324, E27.103, E27.073, 257/E21.682, E21.209, E29.302, E29.309; 438/257, 131, 287
See application file for complete search history.

(56) References Cited

U.S. PATENT DOCUMENTS

| | | | |
|---|---|---|---|
| 4,110,776 A * | 8/1978 | Rao et al. | 257/379 |
| 7,498,651 B2 | 3/2009 | VanZeghbroeck | |
| 7,541,660 B2 | 6/2009 | Schulze et al. | |
| 2004/0016961 A1 * | 1/2004 | Shin et al. | 257/329 |
| 2007/0042546 A1 * | 2/2007 | Thomas et al. | 438/257 |
| 2009/0072340 A1 * | 3/2009 | Zhang et al. | 257/490 |

OTHER PUBLICATIONS

Jaume, D. et al., "High-Voltage Planar Devices Using Field Plate and Semi-Resistive Layers," IEEE Transactions on Electron Devices, vol. 38, No. 7, pp. 1681-1684, Jul. 1991.

Goud, C. Basavana, et al, "Two-Dimensional Analysis and Design Considerations of High-Voltage Planar Junctions Equipped with Field Plate and Guard Ring," IEEE Transactions on Electron Devices, vol. 38, No. 6, pp. 1497-1504, Jun. 1991.

(Continued)

*Primary Examiner* — Victor A Mandala
*Assistant Examiner* — Whitney T Moore
(74) *Attorney, Agent, or Firm* — Marger Johnson & McCollom, P.C.

(57) ABSTRACT

A high voltage power semiconductor device includes high reliability-high voltage junction termination with a charge dissipation layer. An active device area is surrounded by a junction termination structure including one or more regions of a polarity opposite the substrate polarity. A tunneling oxide layer overlays the junction termination area surrounding the active device area in contact with the silicon substrate upper surface. A layer of undoped polysilicon overlays the tunneling oxide layer and spans the junction termination area, with connections to an outer edge of the junction termination structure and to a grounded electrode inside of the active area. The tunneling oxide layer has a thickness that permits hot carriers formed at substrate upper surface to pass through the tunneling oxide layer into the undoped polysilicon layer to be dissipated but sufficient to mitigate stacking faults at the silicon surface.

19 Claims, 9 Drawing Sheets

Etch metal pattern, remove resist, alloy and do electrical test

OTHER PUBLICATIONS

Stockmeier, T., et al., "SIPOS-Passivation for High Voltage Power Devices with Planar Junction Termination," Proceedings of the 3rd International Symposium on Power Semiconductor Devices and ICs, pp. 145-148, Apr. 22-24, 1991, Baltimore MD, IEEE reprint, 1991.

Stengl, R., et al., "Variation of Lateral Doping as a Field Terminator for High-Voltage Power Devices," IEEE Transactions on Electron Devices, vol. ED-33, No. 3, pp. 426-428, Mar. 1986.

Clark, L.E., et al., "Enhancement of Breakdown Properties of Overlay Annular Diodes by Field Shaping Resistive Films," Solid-State Electronics, 1972, vol. 15, pp. 653-657, Pergamon Press, Great Britain.

Blicher, Adolph, Field-Effect and Bipolar Power Transistor Physics, New York, Academic Press, Inc., 1981, pp. 60-84, 226-241, abstract: NASA ADS, http://adsabs.harvard.edu/abs/1981nyap.book, downloaded Feb. 15, 2011.

Matsushita, T., et al., Highly Reliable High-Voltage Transistors by Use of the Sipos Process, IEDM Technical Digest, Washington, Dec. 1975, pp. 167-170.

Munoz, E., et al., Electronic Properties of Undoped Polycrystalline Silicon, Solid-State Electronics, 1974, vol. 17, pp. 439-446, Pergamon Press, Great Britain.

Prasad, R.V., "Structure of Semi-Insulating Polycrystalline Silicon (SIPOS)," MSEE Thesis, Carnegie Mellon University, 1986, Pittsburgh, Pennsylvania.

* cited by examiner

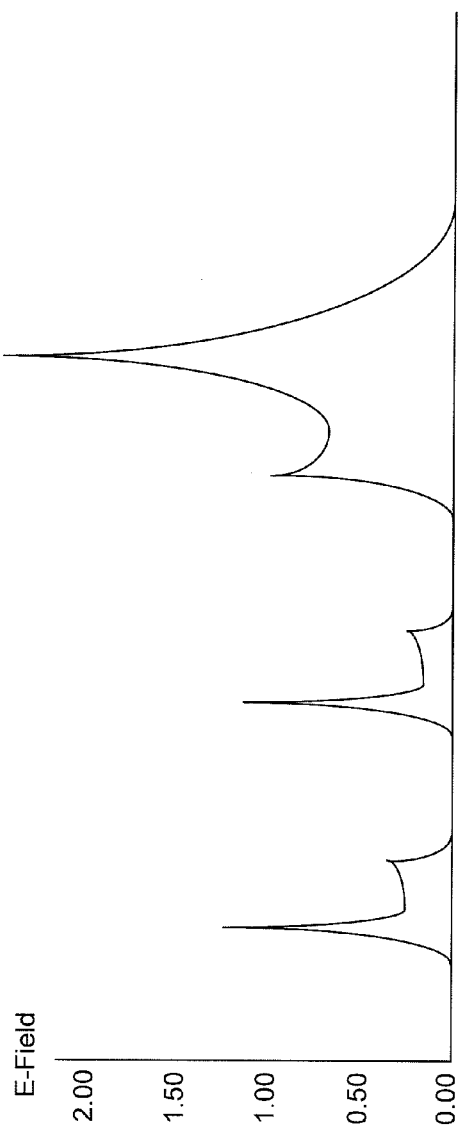
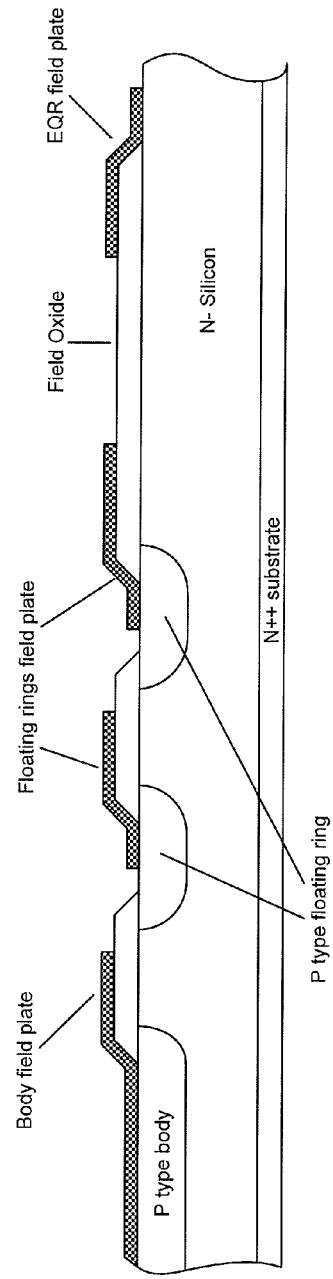
FIG. 1A
FIG. 1B
PRIOR ART

Starting material

Grow oxide

Etch windows into oxide using photoresist mask

Cut contacts in oxide using a photoresist mask

Deposit metal and pattern with mask

Etch metal pattern, remove resist, alloy and do electrical test

Charge Dissipation concept applied to HV termination with plurality of field limiting rings and intervening rings

HIGH RELIABILITY-HIGH VOLTAGE JUNCTION TERMINATION WITH CHARGE DISSIPATION LAYER

RELATED APPLICATION DATA

This application claims the benefit of U.S. Provisional Application Ser. No. 61/305,601, filed Feb. 18, 2010, herein incorporated by reference.

BACKGROUND OF THE INVENTION

This invention pertains to high power, high voltage devices with increased stability of breakdown voltage at increased temperatures and increased reverse bias (HTRB test), and more particularly to high voltage termination structures in silicon power devices.

It is known to persons familiar with the art that high voltage terminations in power devices are unstable under high voltage high temperature stresses (HTRB) due the changes in the distribution of charge in silicon, changes induced by the movement or the injection of the charge in the oxide overlaying the silicon in the termination region.

Most, if not all, high voltage termination in silicon power devices consist of layers of opposite polarity (e.g. P-layers if the starting material is N-doped Silicon) covered by oxide, in most, if not all, cases thermally grown. The overlaying oxide has to have low mobile charge and low interface traps, susceptible to become "charged" under the high electric field conditions which are normal when the semiconductor device is under high voltage reverse bias conditions, especially if the ambient temperature is also high.

A few not limiting examples of high voltage termination are: annular P-type rings; P rings with field plates (floating or connected to the P-rings); continuous P-ring with spiral layout; RESURF termination; and variable lateral doping (VLD) termination or junction termination extension. In all cases, bi-dimensional simulations indicate multiple high electric field points in the structure. An illustration of such a TCAD bi-dimensional simulation is shown in FIG. 1A for a power device of the type illustrated in FIG. 1B. FIG. 1A shows electric field distribution across a P-ring termination with floating field plates. High peaks of electric field are visible in the silicon substrate and at the Si—SiO2 interface. Such high electric points in the structure are prone to generate hot carriers, hot electrons and hot holes, that can reach energy levels high enough to jump into the oxide as illustrated in FIGS. 1C and 1D. Once trapped in the oxide, the hot carriers (hot holes in particular) can deplete the P-type regions underneath the oxide or can accumulate in the N-type doping and the surface, in both cases degrading the blocking capability of the device. Such trapping and degradation also appears in the case of junction termination extension as shown in FIGS. 1E and 1F.

More so, charge of either sign (positive or negative) can diffuse through the passivation layer into the field oxide (the oxide grown or deposited in the termination area) and can pile up at the boundaries of the P diffused rings. The presence of the charge in the oxide (either "injected" from the silicon due to the high concentration of hot carriers or diffused through the oxide due to harsh environment conditions) alters the distribution of doping in silicon and creates conditions for an even higher electric field, therefore degrading the blocking voltage of the device. Similar problems can occur with N diffused rings in a P-type substrate.

An example of an attempted solution to this problem is described by D. Jaume et al., High-Voltage Planar Devices Using Field Plate and Semi-Resistive Layers, IEEE Transactions on Electron Devices, Vol. 38, No. 7, July 1991, pp. 1681-84. Their solution involves depositing a semi-insulating polycrystalline silicon (SIPOS) layer over the 1.25 micron thick oxide layer overlaying the silicon substrate. A similar approach is described in C. B. Goud, Two Dimensional Analysis and Design Considerations of High Voltage Planar Junctions Equipped with Field Plate and Guard Ring, IEEE Transactions on Electron Devices, Vol. 38, No. 6, June 1991, pp. 1497-1504. This approach omits the SIPOS layer but show results for oxide layers ranging from about 1.5 micron to over 8 microns thickness.

The approach of using a thick oxide layer overlaying the silicon substrate continues to be used, as shown, for example in Schulze et al. U.S. Pat. No. 7,541,660, (Jun. 2, 2009), together with laterally varying dopant density in the field limiting rings. The foregoing arrangements reduce field effects but do not eliminate charge trapping problems.

Another approach applicable to wide-band gap power devices, described in Van Zeghbroeck U.S. Pat. No. 7,498,651, interconnects the rings of the termination structure formed on top of a SiC substrate around an active area by means of resistive shorting bars. Such devices do not face the same problem as in silicon devices wherein the termination structure is implanted or diffused into the substrate because the substrate is more highly doped.

A much older approach is described in the textbook by A. Blicher, Field-Effect and Bipolar Power Transistor Physics (1981) at pp. 60 and 227-229, citing L. E. Clark and D. S. Zoroglu, Enhancement of Breakdown Properties of Overlay Annular Diodes by Field Shaping Resistive Films, Solid State Electronics, 15: 653-657, 1972. In this article, the authors compare using a layer of thick oxide (7 microns) on the silicon surface with a layer of undoped polysilicon film of 200 nm thickness over a 2 micron layer of oxide on the silicon surface. Blicher then states at page 61 that a considerably improved version of the simple polycrystalline film is the semi-insulating polycrystalline silicon (Sipos) described in the next section of the text. In that section and again at page 230, the author cites (at Page 230) Aoki et al, Oxygen-doped Polycrystalline Silicon Films Applied to Surface Passivation, J. Electrochem. Soc. Technical Digest, March 1975, pp. 167-170, and Matsushita et al, Highly Reliable High Voltage Transistors by Use of the SIPOS Process, IEDM Technical Digest, Washington, December 1975, 167-170 as using an oxygen-doped polycrystalline (Sipos) film in place of the silicon dioxide layer, and then applying silicon nitride and oxide films. In footnote 1 on page 228, the author states that Aoki et al used direct deposition on silicon of polycrystalline silicon containing 10-25 weight percent oxygen and found it superior to the directly deposited, undoped polycrystalline films from a surface stability and leakage point of view. Matsushita et al (coauthor with Aoki) used a triple layer structure including a 5000 Å thick oxygen-doped polycrystalline silicon. The use of variations of the Sipos structure has been established as the usual passivation approach in the field, and use of undoped polycrystalline silicon has not been favored.

Because of discontinuities and stacking faults at the interface between the underlying silicon epi or substrate surface and the deposited polysilicon layer, however, the Sipos structure causes increased leakage current. According to Blicher, Matsushita et al. report that the leakage current in the Sipos film can be as small as if passivated by silicon dioxide if the oxygen concentration in the polysilicon is sufficiently high. But if, as Blicher explains at page 61, the Sipos film is made too resistive by excessive oxygen doping, then the breakdown approaches that of thermal oxide. This approach thus presents tradeoffs between leakage current and breakdown characteristics.

Accordingly, a need remains for a better way to form an edge termination structure in silicon power devices with high voltage blocking capability and with a stable blocking voltage under the most adverse conditions by eliminating the conditions of charge injection in an oxide overlaying the edge termination while controlling leakage current.

SUMMARY OF THE INVENTION

Embodiments of the present disclosure provide a "charge dissipation" path in the immediate vicinity of the high electric field points, namely at the very top surface of the silicon underneath an overlaying silicon dioxide layer, overlaying the termination structure formed in the silicon substrate surrounding the active area of the device.

This invention applies to any type of high voltage semiconductor device, such as MOSFETs, IGBTs, FREDs, Bipolar Transistors or Thyristors, formed on a silicon substrate. The substrate can be monocrystalline silicon or can include one or more epitaxial silicon layers. The upper portion or layer of the substrate can be N-type, in which P-type rings or termination extension are diffused or implanted to form the termination structure, or can be P-type, in which N-type rings or termination extension are diffused or implanted to form the termination structure. In the case of floating rings, the termination structure thus presents alternating P and N-type rings at the substrate surface around the periphery of the active area containing the high voltage semiconductor device. The rings can be circular, oval oblong or rectangular, as suits the shape of the active area and the device. In the case of a junction termination extension, the termination structure overlapping areas of highly-doped and less highly doped P-type in and N-type substrate, or vice versa.

The charge dissipation layer, also interchangeably termed herein a charge bleeding layer, consists of a thin layer of undoped polysilicon, connected to the outer edge of the structure (for most designs this is the scribe line or the electrode connected to the scribe line) and to the grounded electrode inside of the active area (anode for a diode, emitter for a bipolar transistor, or the source for a power MOSFET or IGBT). The charge dissipation layer is formed over a tunneling oxide layer, which is thin enough that hot carriers at the interface of the underlying silicon surface and the tunneling oxide layer can pass through the tunneling oxide layer into the charge dissipation layer.

In this way, any charge "injected" in the polysilicon layer gets "dissipated" into the grounded electrode, preventing any charge accumulation in the termination area and preserving the initial conditions of the electric field, such that the Blocking Voltage of the device does not change under high temperature, high reverse bias conditions (HTRB).

The tunneling oxide layer is generally less than 40 Å thick and preferably in the range of 20-30 Å thick. The tunneling oxide layer is preferably thick enough to mitigate discontinuities or stacking faults at the silicon upper surface.

In one embodiment, the charge bleeding layer can be patterned as a contiguous layer (see FIG. 2) contacting the tunneling oxide layer overlaying the silicon substrate surface in areas overlaying the implanted or diffused termination rings or extensions.

In another embodiment. the charge dissipation or bleeding layer can be patterned as a network of thin undoped polysilicon overlaid on the tunneling oxide layer atop the ring structure or termination extension such that the polysilicon ladder (see FIG. 3) overlays all high electric field localities of the termination.

The foregoing and other objects, features and advantages of the invention will become more readily apparent from the following detailed description of a preferred embodiment of the invention that proceeds with reference to the accompanying drawings.

DETAILED DESCRIPTION

Figure 1C:
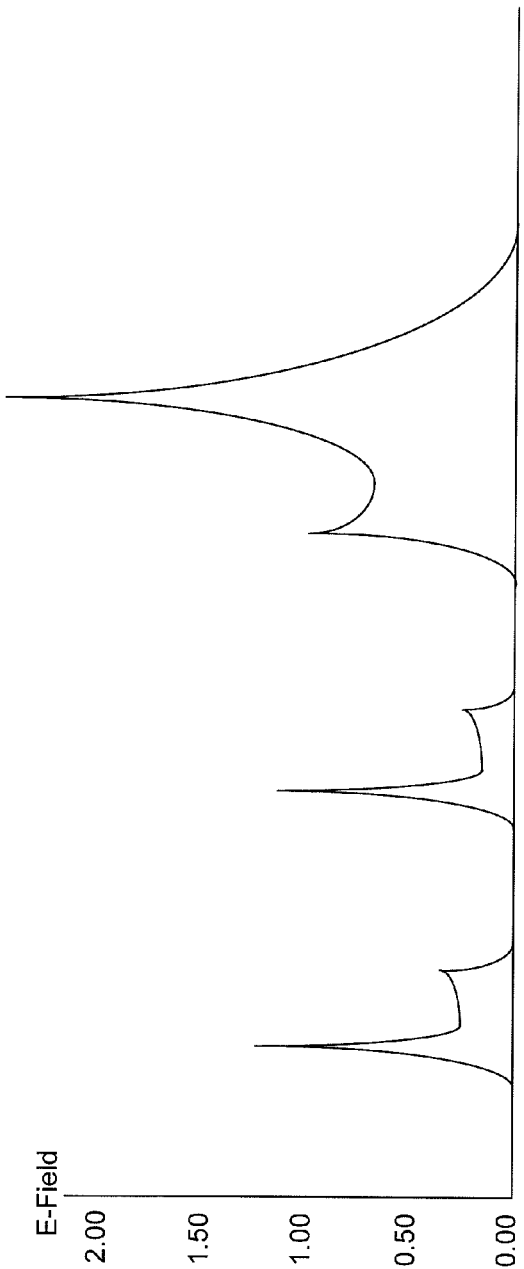
FIG. 1C is a simulation plot showing charge buildup coinciding with the areas of charge accumulation indicated by + signs in the cross-section of the device shown in FIG. 1D.
Figure 1D:
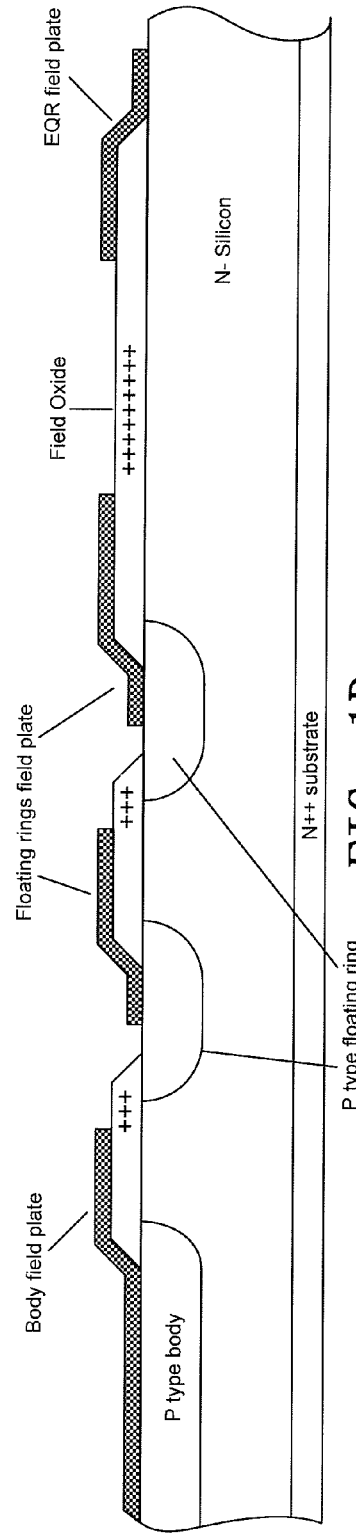
FIG. 1A is a simulation plot showing electric field distribution across a P-ring termination with Floating Field Plates in an example of a prior art silicon power MOSFET and FIG. 1B is a cross-sectional diagram of the exemplary power MOSFET.
FIG. 1E is a simulation plot showing electric field distribution across a P-type junction termination extension shown in the cross-sectional diagram of FIG. 1F.
Figure 1E:
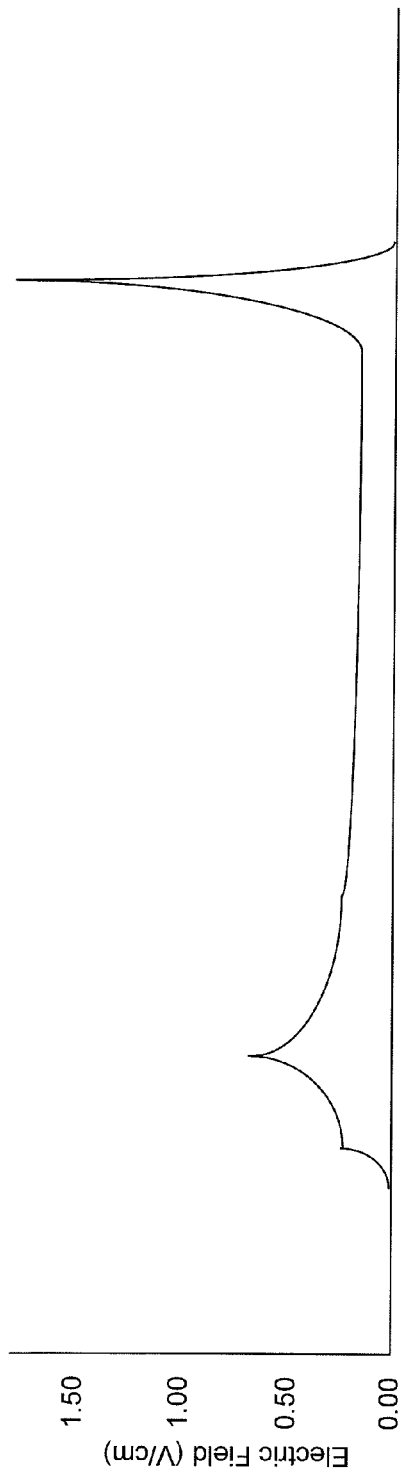
Figure 1F:
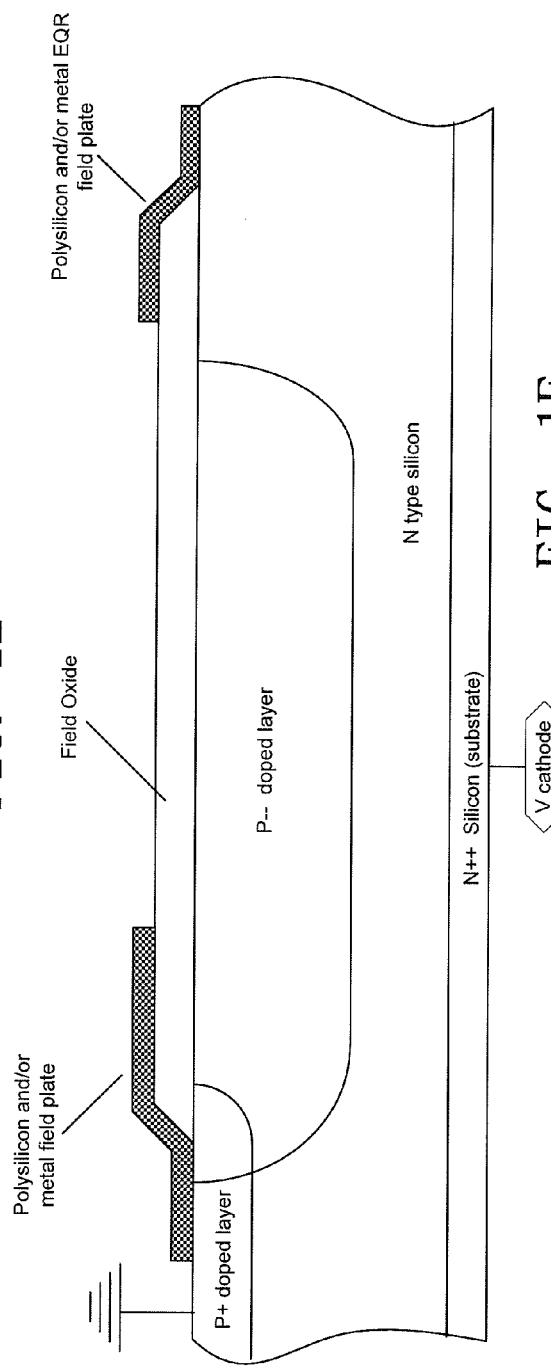
Figure 2A:
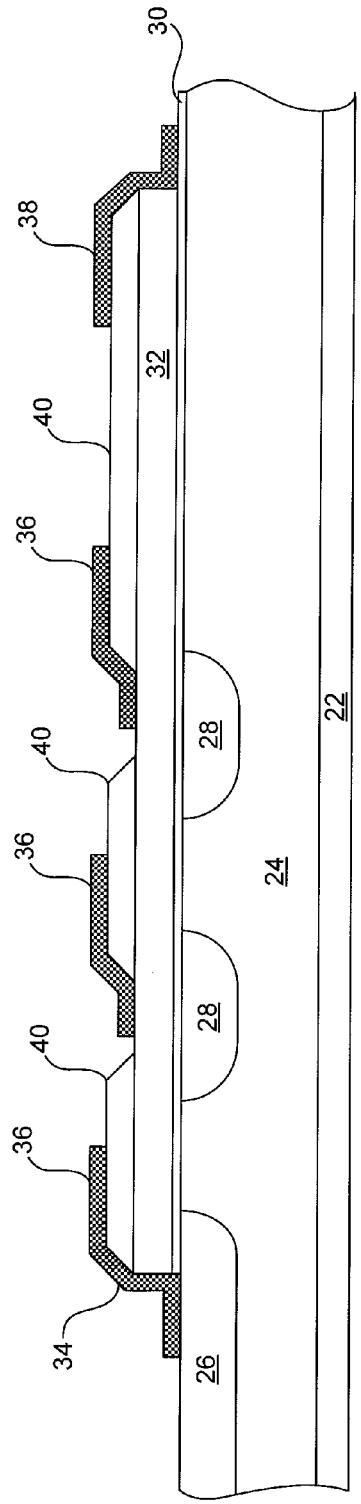
FIG. 2A is a cross-sectional view of a first embodiment of an edge termination structure using floating rings in a silicon power device according to the invention.

FIG. 2A is a cross-section showing a first embodiment of the charge dissipation or bleeding layer used in a termination structure in a power semiconductor device. In this example, the silicon substrate includes an N++ layer 22 with an N− epitaxial layer 24. In an active area is shown a P-type body region 26 (in the case of a power MOSFET or IGBT) surrounded by junction termination structure which, in this case, comprises multiple annular P-type floating rings 28. The particular type of power device and junction termination structure is merely exemplary and not intended to be limiting of the invention.

A thin layer of undoped polysilicon layer 32 is applied over the top part of the junction termination structure, in intimate contact with an intervening tunneling oxide layer 30 formed on the upper surface of the silicon substrate. The undoped polysilicon layer 32 connects on one end to the active device area (e.g., body region 26) and front side metal or body field plate 34 (either directly or through the diffused layers) and at the other end it is tied to an equipotential ring which is part of the scribe line and field plate 38.

The undoped polysilicon layer 32 is relatively thin, in the range of 300 Å to 1000 Å thick and preferably 400 Å to 750 Å thick, and has a resistivity of at least 100K Ohm-cm. The intervening tunneling oxide layer 30 is thin enough to permit hot carriers formed at substrate upper surface to pass through the tunneling oxide layer into the undoped polysilicon layer to be dissipated. The tunneling oxide layer is generally less than 40 Å thick and preferably in the range of 20-30 Å thick. The tunneling oxide layer is preferably thick enough to mitigate discontinuities or stacking faults at the silicon upper surface.

Areas of field oxide 40 are formed over the undoped polysilicon layer 32 at locations spanning the area between the P-body region and the first ring, and the areas between each successive outward pair of rings. Field plates 36 are formed over the field oxide areas 40 in conventional field plate locations.

Figure 2B:
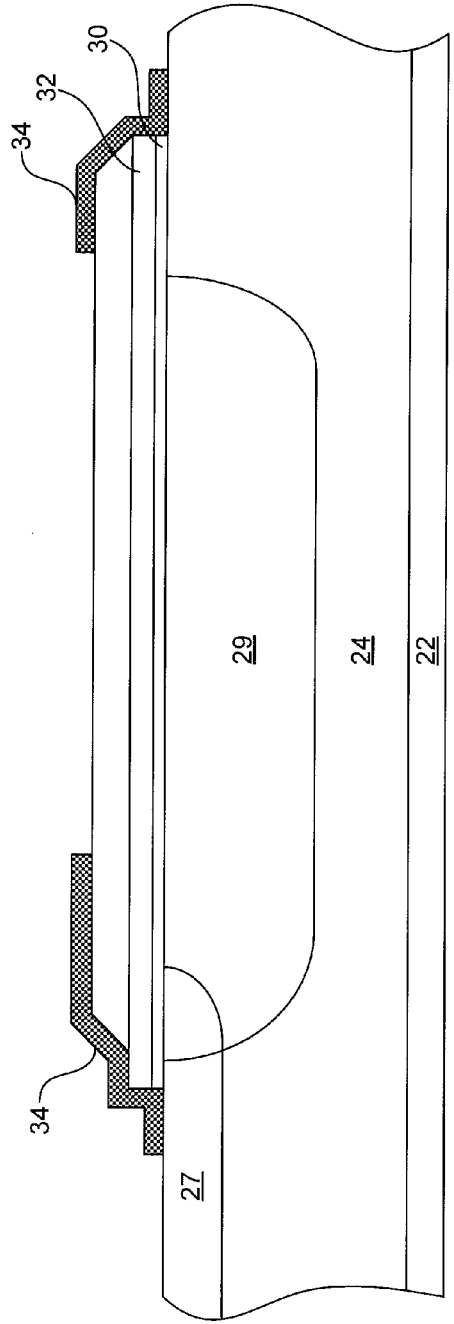
FIG. 2B is a cross-sectional view of a second embodiment of an edge termination structure using junction termination extension in a silicon power device according to the invention.

FIG. 2B is a cross-section of a second embodiment of the charge dissipation or bleeding layer used in a simpler, junction termination structure in a power semiconductor device, such as in a diode. Features in common with the embodiment of FIG. 2A are labeled with like reference numerals and not further described. In this example the active area includes a P+ diffusion or implant 27. Instead of floating rings 28, the junction termination structure is a junction termination extension 29 formed by a P– doped implant or diffusion 29 that overlaps and extends away from a margin of the P+ diffusion or implant 27. The undoped polysilicon layer 32 and intervening tunneling oxide layer 30 are formed on the upper surface of the silicon substrate in position to overlap the margin of the P+ diffusion or implant 27 and extend outward from the active area past the outer edge of the junction termination extension 29. The undoped polysilicon layer 32 is capped by a field oxide layer and connects at its inner and outer ends to the field plates 34 and 38.

So far, the undoped polysilicon layer 32 has been treated as a contiguous sheet. This is not essential. The undoped polysilicon layer may be patterned so as to coincide with areas of likely charge accumulation, for example, as next described.

Figure 3:
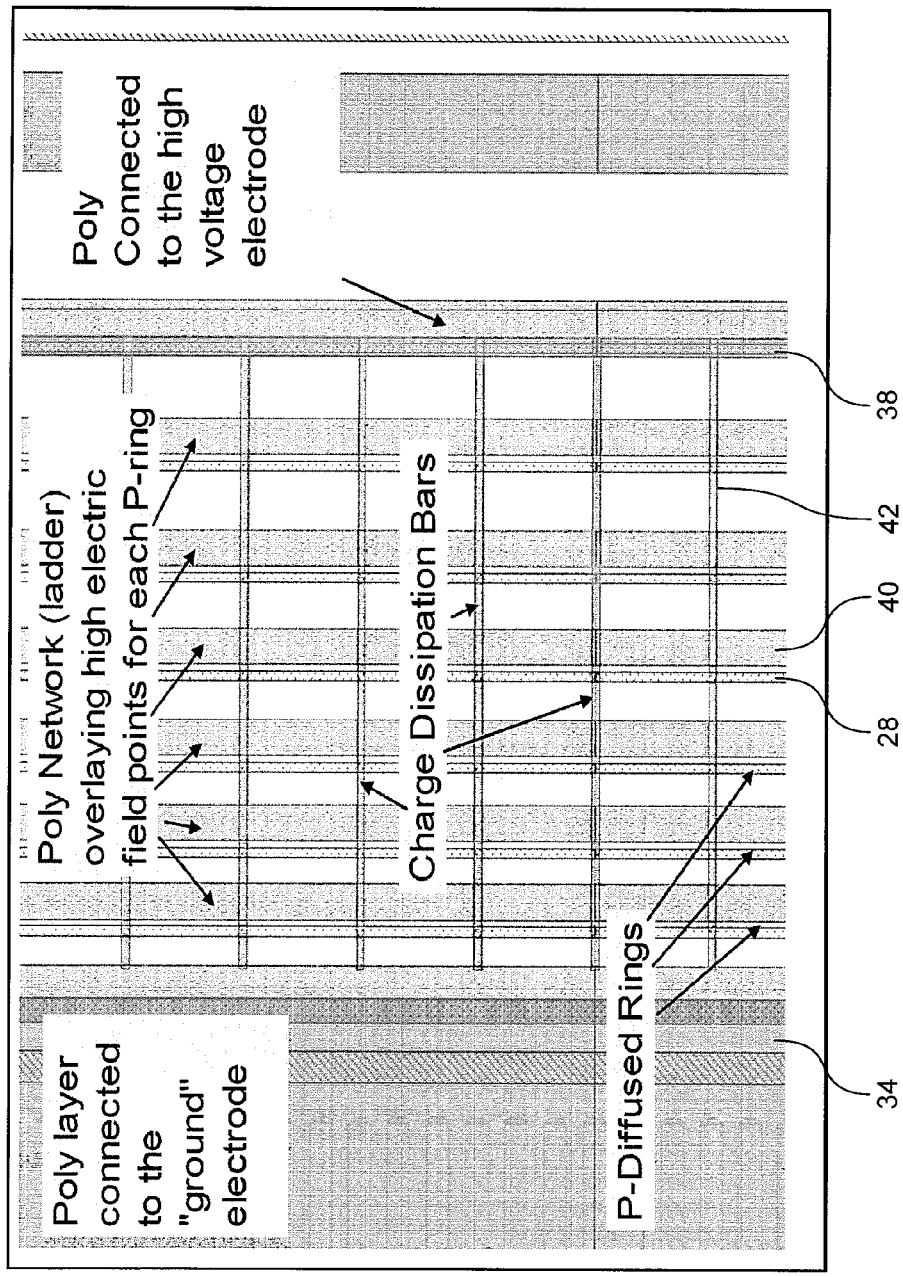
FIG. 3 is plan view of another embodiment of an edge termination structure using floating rings as in FIG. 2A with the charge bleed layer formed as a network.

FIG. 3 is a plan view of another embodiment of the invention, showing the layer of thin undoped polysilicon formed as a network or matrix. This example pertains to the junction termination structure shown in cross-section in FIG. 2A. The network includes a grid of undoped polysilicon stripes 40 that parallel the P-type termination rings 28 and transverse charge dissipation or linking bars 42 interconnect the polysilicon stripes 40 and connect to the active device and equipotential ring in the manner described above for FIG. 2A. The polysilicon stripes 40 are offset from the P-rings in such way that they overlie all high electric field points in the structure; areas where the rate of hot carrier injection in the silicon surface would be extremely high, are covered with undoped polysilicon and any charge accumulation can dissipate away from those areas via the charge dissipation or linking bars 42. This "charge dissipation ladder" prevents any accumulation of charge in the surface above silicon and preserves the electric field distribution (and therefore the breakdown voltage) throughout any type of stress. The concept of this patterned grid or ladder can be extended to other junction termination structures, for example, to the junction termination structure of FIG. 2B.

Following is a description of the process flow applicable to the high voltage termination structure of a diode with P-rings, but the invention is not limited only to this type of HV termination. With simple mask changes, it can be adapted to the structures of FIGS. 2A, 2B and 3.

Figure 4:
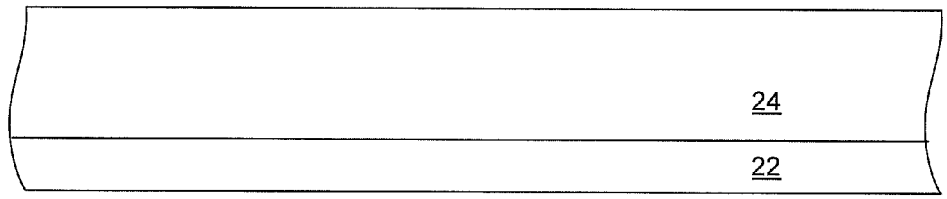
FIGS. 4-12 are successive cross-sectional views of a process for fabricating the first embodiment of an edge termination structure.
Figure 5:
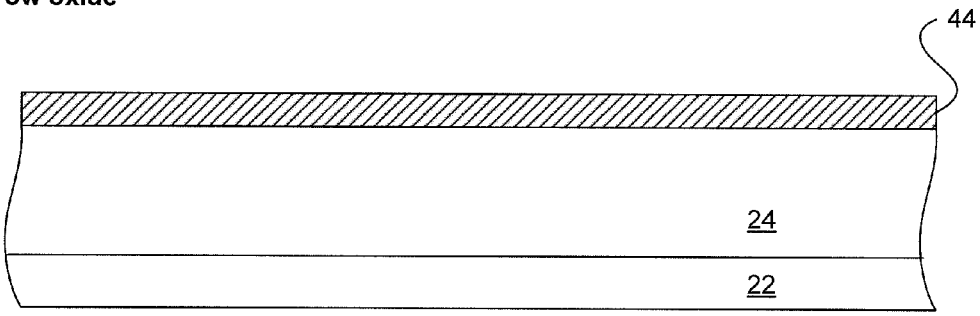
Figure 6:
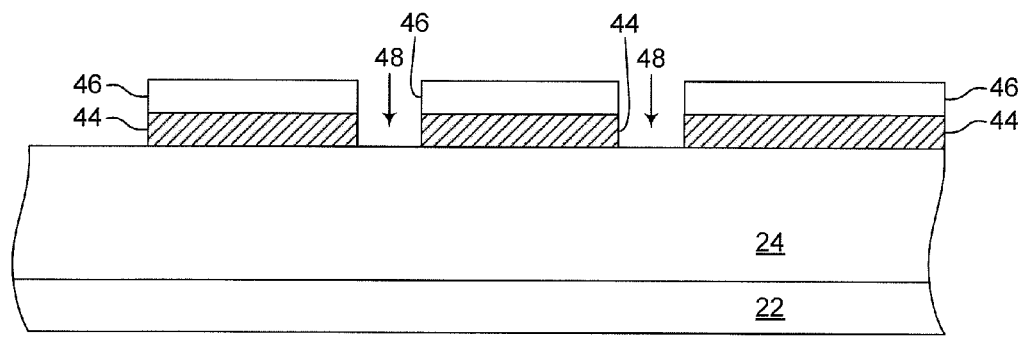
Figure 7:
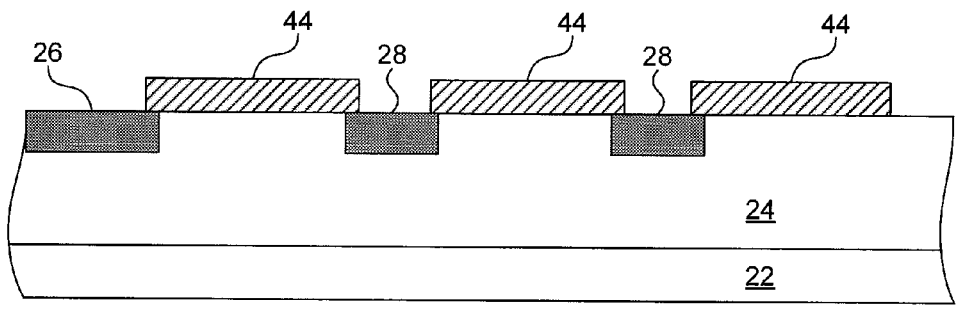
Figure 8:
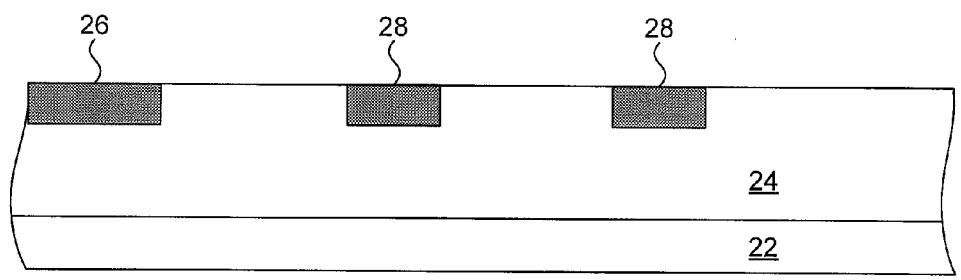

FIG. 4 shows a suitable beginning silicon substrate with an N++ substrate layer 22 and N– epitaxial layer 24. FIG. 5 shows formation (e.g., thermal growth or deposition) of an oxide layer 44, which is patterned in FIG. 6 with photoresist using a mask. Openings 48 for P-rings 26, 28 are placed at specific locations across the termination, either using resist 46 as implant blocking mask or using patterned field oxide as shown in FIG. 7. Example doping concentration (Nd=1e13-1e15 cm3) The P-rings 28 and P-body or anode 26 are diffused in at the required depth (the depth and the spacing of the rings determines the blocking capability of the device). In the subsequent step, shown in FIG. 8, the entire oxide 44 over the termination structure is stripped off.

Figure 9:
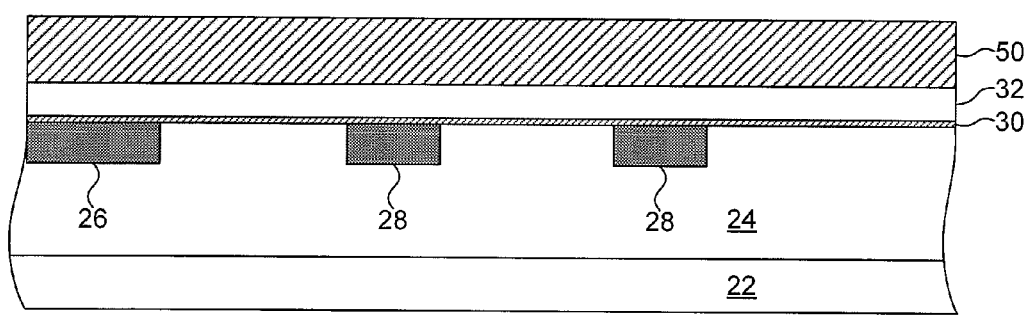

Referring to FIG. 9, a thin tunneling oxide layer 30 is formed on the upper silicon surface, typically by thermal growth but alternatively by LTO deposition. The tunneling oxide layer is formed to be generally less than 40 Å thick and preferably in the range of 20-30 Å thick.

The thin layer of undoped polysilicon 32 is then deposited across the wafers, thickness of poly 400-750 Å (less than 1000 Å but thicker than 300 Å). The thin layer polysilicon is connected to the main terminal (active area) through the contact window and to the outside of the termination through an EQR (equipotential ring) electrode tied to the substrate of the first polarity. No in-situ doping of the polysilicon is allowed and the temperature of the deposition is controlled such that the grains of the polysilicon layer are as small as possible. For example, the undoped polysilicon is preferably deposited using a LPCVD process, where the temperature is chosen such the grain size is in the range of 1000 Å (deposition temperature between 600-620 C). The undoped polysilicon layer can be left unpatterned as in the FIGS. 2A and 2B embodiments, or can be further patterned as in the FIG. 3 embodiment.

Figure 10:
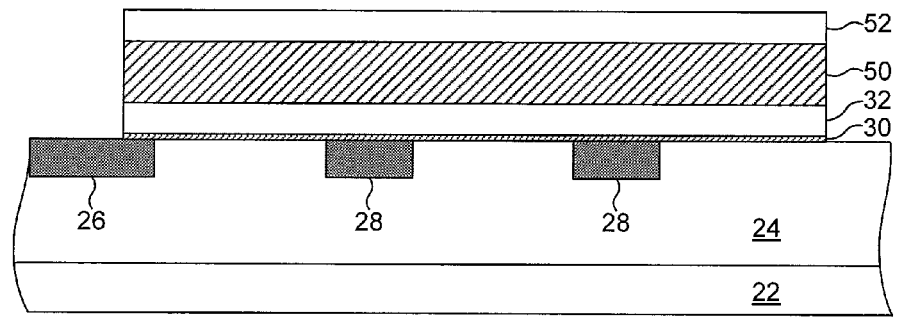

Next, the wafers are covered with a deposited layer of silicon dioxide to protect the underlying layer of polysilicon during the next process steps and photoresist 52 is applied and patterned, for example as shown in FIG. 10. From this point on, the wafers are "ready" to be processed as required by the "standard" process flow of the device to be made. If MOSFETs or IGBTs are the final product, then active area (to the left of the cross section) is opened and gate oxide, gate poly, body and source implants and so on are put in place. If a fast recovery diode (FRED) is the final product, then an opening is made in the center of the die and the required doping to create the "anode" of the FRED is formed. In the example where a MOSFET structure is to be made, gate oxide and gate polysilicon layers are grown and deposited respectively on the entire surface of the wafers. The gate polysilicon layer is later etched using the desired pattern and the body, source and front side metal (not shown in the cross section) are put in place.

Figure 11:
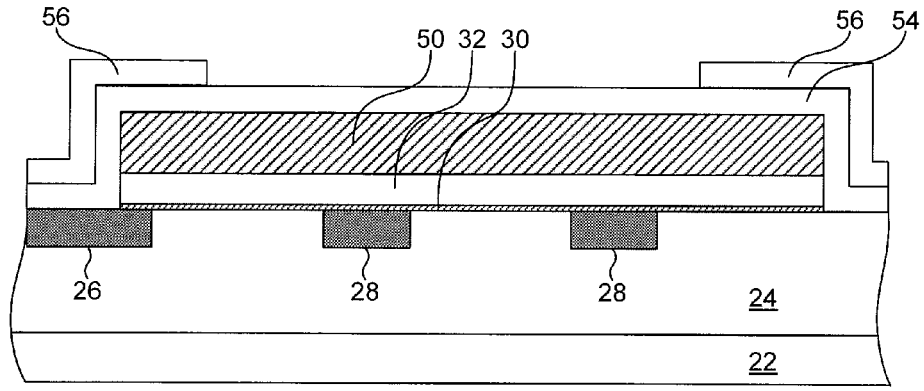
Figure 12:
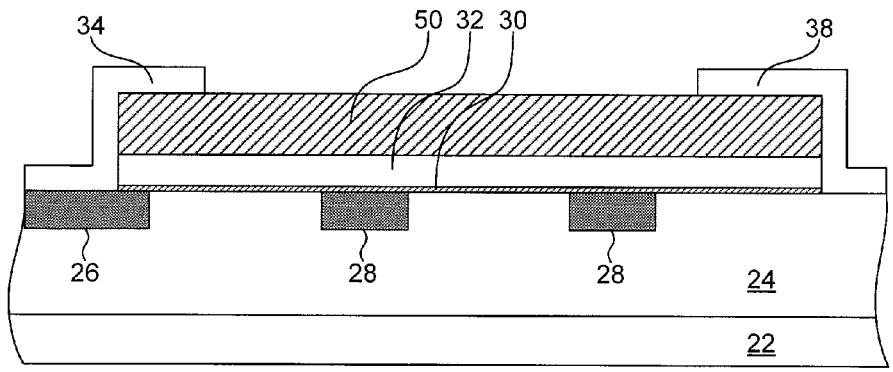
Figure 12A:
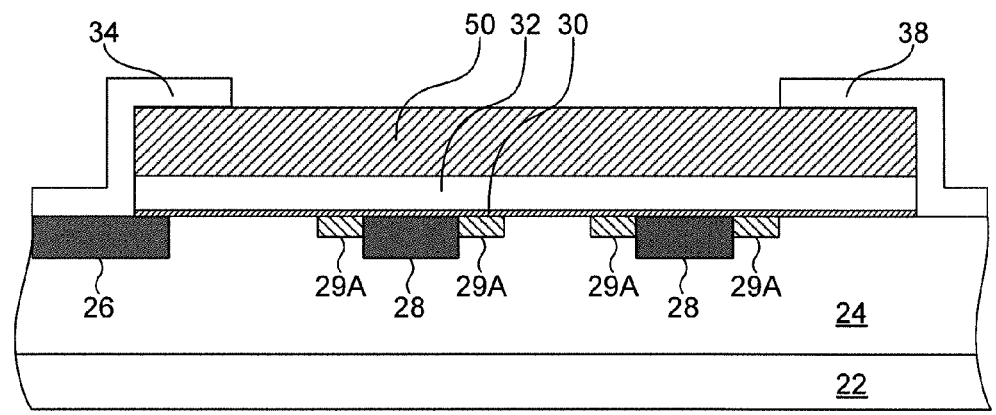
FIG. 12A is a cross-sectional view of a variation of the edge termination structure of FIG. 12.

FIG. 11 shows a further step in completion of the termination structure. A metal or doped polysilicon layer 54 is deposited to electrically couple the undoped polysilicon layer 32 to an outer edge of the junction termination structure, followed by a photoresist layer 56 which is patterned to expose an area of metal layer 54 over the oxide layer 50. The exposed metal is the etched away to expose the oxide 50 and separate the metal 54 into field plates 34, 38 as shown in FIG. 12. More complex masking can be used to form intermediate field plates 36 as in FIG. 2A. The above-described charge dissipation concept can also be applied to a high voltage junction termination structure that includes multiple rings 28 of a second polarity opposite the first polarity formed in the substrate and extending to the surface thereof spaced-apart by intervening rings 29A of the doped silicon layer of the first polarity as shown in FIG. 12A.

Having described and illustrated the principles of the invention in various embodiments thereof, it should be apparent that the invention can be modified in arrangement and detail without departing from such principles. We claim all modifications and variations coming within the spirit and scope of the following claims.

The invention claimed is:

1. A high voltage power semiconductor device comprising:
a substrate having an upper surface and including an active device area having a periphery and a junction termination area surrounding the active device area, the substrate being formed of a doped silicon layer of a first polarity;
a junction termination structure including one or more regions of a second polarity opposite the first polarity formed in the substrate and extending to the surface thereof to form one or more termination junctions in the junction termination area surrounding the active device;
a tunneling oxide layer overlaying the junction termination area surrounding the active device area in contact with the silicon substrate upper surface;
a layer consisting of undoped polysilicon overlaying the tunneling oxide layer and spanning the junction termination area in contact with the silicon substrate upper surface; and
electrical connections of the undoped polysilicon layer to an outer edge of the junction termination structure and to a grounded electrode inside of the active area;
the tunneling oxide layer having a thickness that permits hot carriers formed at substrate upper surface to pass through the tunneling oxide layer into the undoped polysilicon layer to be dissipated.

2. A high voltage power semiconductor device according to claim 1 including a layer comprising silicon dioxide overlaying the undoped polysilicon layer.

3. A high voltage power semiconductor device according to claim 1 in which the undoped polysilicon layer has a thickness of 300 Å to 1000 Å.

4. A high voltage power semiconductor device according to claim 1 in which the undoped polysilicon layer has a thickness of 400 Å to 750 Å.

5. A high voltage power semiconductor device according to claim 1 in which the undoped polysilicon layer has a granular composition of less than 1500 Å average grain size.

6. A high voltage power semiconductor device according to claim 1 in which the undoped polysilicon layer has a granular composition of less than 1000 Å average grain size.

7. A high voltage power semiconductor device according to claim 1 in which the undoped polysilicon layer has resistivity of at least 100K Ohm-cm.

8. A high voltage power semiconductor device according to claim 1 in which the undoped polysilicon layer contiguously covers the junction termination structure.

9. A high voltage power semiconductor device according to claim 1 in which the undoped polysilicon layer is patterned as a network over the junction termination structure in which a strip of the polysilicon layer is positioned adjacent each of the rings of a second polarity and the strips are interconnected by charge dissipation bars.

10. A high voltage power semiconductor device according to claim 1 in which the junction termination structure includes multiple rings of a second polarity opposite the first polarity formed in the substrate and extending to the surface thereof spaced-apart by intervening rings of the doped silicon layer of the first polarity.

11. A high voltage power semiconductor device according to claim 1 in which the junction termination structure includes a field plate, the field plate being either polysilicon or metal and extending over a field oxide to a predetermined length.

12. A high voltage power semiconductor device according to claim 1 in which the junction termination structure includes a junction termination extension (JTE) formed by a single or multiple lightly-doped regions of second polarity and connected to the main junction of the main device.

13. A high voltage power semiconductor device according to claim 1 in which the junction termination structure includes a variable lateral doping (VLD termination), formed by multiple islands of second polarity, placed around the active area in a predetermined arrangement but not to form contiguous rings or areas of the second polarity doping.

14. A method of making a high voltage power semiconductor device, the method comprising:
providing a substrate formed of a doped silicon layer of a first polarity having an upper surface;
defining on the substrate an active device area having a periphery and a junction termination area surrounding the active device area;
forming a junction termination of a second polarity opposite the first polarity in the substrate and extending to the surface thereof;
forming a tunneling oxide layer on the upper surface of the substrate over the junction termination area;
depositing a layer consisting of undoped polysilicon over the tunneling oxide layer overlaying the junction termination area; and
coupling the undoped polysilicon layer electrically to an outer edge of the junction termination structure and to a grounded electrode inside of the active area.

15. A method of making a high voltage power semiconductor device according to claim 14, including depositing a layer comprising silicon dioxide over the undoped polysilicon layer.

16. A method of making a high voltage power semiconductor device according to claim 14, in which the undoped polysilicon layer is patterned to contiguously cover the junction termination structure.

17. A method of making a high voltage power semiconductor device according to claim 14, in which the undoped polysilicon layer is deposited so as to minimize granularity.

18. A high voltage power semiconductor device comprising:
a substrate having an upper surface and including an active device area having a periphery and a junction termination area surrounding the active device area, the substrate being formed of a doped silicon layer of a first polarity;
a junction termination structure including one or more regions of a second polarity opposite the first polarity formed in the substrate and extending to the surface thereof to form one or more termination junctions in the junction termination area surrounding the active device;
a tunneling oxide layer overlaying the junction termination area surrounding the active device area in contact with the silicon substrate upper surface;
a layer consisting of undoped polysilicon overlaying the tunneling oxide layer and spanning the junction termination area in contact with the silicon substrate upper surface; and
connections to an outer edge of the junction termination structure and to a grounded electrode inside of the active area;
the tunneling oxide layer having a thickness that permits hot carriers formed at substrate upper surface to pass through the tunneling oxide layer into the undoped polysilicon layer to be dissipated; and the undoped polysilicon layer being patterned as a network over the junction termination structure in which a strip of the polysilicon layer is positioned adjacent each of the rings of a second polarity and the strips are interconnected by charge dissipation bars.

19. A method of making a high voltage power semiconductor device, the method comprising:

providing a substrate formed of a doped silicon layer of a first polarity having an upper surface;

defining on the substrate an active device area having a periphery and a junction termination area surrounding the active device area;

forming a junction termination of a second polarity opposite the first polarity in the substrate and extending to the surface thereof;

forming a tunneling oxide layer on the upper surface of the substrate over the junction termination area;

depositing a layer consisting of undoped polysilicon over the tunneling oxide layer overlaying the junction termination area;

coupling the undoped polysilicon layer electrically to an outer edge of the junction termination structure and to a grounded electrode inside of the active area, and patterning the undoped polysilicon layer as a network over the junction termination structure in which a strip of the polysilicon layer is positioned adjacent each of the rings of a second polarity and the strips are interconnected by charge dissipation bars.

* * * * *